United States Patent [19]

Kiyono et al.

[11] Patent Number: 5,460,995
[45] Date of Patent: Oct. 24, 1995

[54] FULLY CMOS-TYPE SRAM DEVICE AND METHOD FOR FABRICATING THE SAME

[75] Inventors: Junji Kiyono; Yasushi Yamazaki, both of Tokyo, Japan

[73] Assignee: NEC Corporation, Tokyo, Japan

[21] Appl. No.: 260,904

[22] Filed: Jun. 15, 1994

Related U.S. Application Data

[62] Division of Ser. No. 936,336, Aug. 28, 1992, Pat. No. 5,352,916.

[30] Foreign Application Priority Data

Aug. 30, 1991 [JP] Japan .................................. 3-244856

[51] Int. Cl.$^6$ .................................................. H01L 21/8244
[52] U.S. Cl. ........................ 437/52; 437/48; 437/56; 437/57; 437/915
[58] Field of Search ........................ 437/48, 52, 56, 437/57, 915

[56] References Cited

U.S. PATENT DOCUMENTS

| 4,272,880 | 6/1981 | Pashley | 437/915 |
| 4,980,732 | 12/1990 | Okazawa | 357/23.5 |
| 5,132,771 | 7/1992 | Yamanaka et al. | 357/59 |

FOREIGN PATENT DOCUMENTS

| 40716 | 2/1987 | Japan . |
| 1-166554 | 6/1989 | Japan . |
| 1-202858 | 8/1989 | Japan . |

OTHER PUBLICATIONS

"A Memory Cell with Polysilicon Thin Film Transistor (TFT) for a 4Mbit SRAM", Kazuhito Tsutsumi et al., Singaku Giho, vol. 90, No. 48, pp. 7–13 (SMD90-25).

Primary Examiner—Tom Thomas
Attorney, Agent, or Firm—Burns, Doane, Swecker & Mathis

[57] ABSTRACT

A grounding wiring layer is provided on the substantially entire region between driver MOS transistors and load MOS thin film transistors of a flip-flop type memory cell. The contact holes for connecting the gate electrodes of the MOS thin film transistors with storage nodes are formed by providing a side wall on the inner wall of each of the contact hole portions formed in the grounding wiring layer and inter-layer insulating films sandwiching it. Thus, the impedance of the grounding wiring layer can be reduced to stabilize the operation of a miniaturized SRAM memory cell using the load MOS thin film transistors. The resistance against for software error caused by α-ray can also be improved.

1 Claim, 4 Drawing Sheets

FULLY CMOS-TYPE SRAM DEVICE AND METHOD FOR FABRICATING THE SAME

This application is a divisional, of application Ser. No. 07/936,336, filed Aug. 28, 1992 now U.S. Pat. No. 5,352, 916.

BACKGROUND OF THE INVENTION

1. Field of the Invention

The present invention relates to a CMOS-type SRAM device and a method for fabricating the same, and more particularly to a fully CMOS-type SRAM device in which load transistors of a flip-flop memory cell are constructed by p-channel thin-film MOS transistors and a method for fabricating the same.

2. Description of the Related Art

The memory cell structure of a fully CMOS-type SRAM device is disclosed in, e.g., "SINGAKU GIHO" Vol. 90, No. 48, pp. 7–13 (SDM90-25), JP-A-1-166554, and JP-A-1-202858. Its typical example will be explained with reference to FIGS. 1A, 1B and FIG. 2. FIGS. 1A and 1B are plan views of a fully CMOS-type SRAM which has as load elements bottom-gate type p-channel MOS thin film transistor (hereinafter simply referred to as "p-TFTs"). FIG. 2 is a sectional view taken along the line A—A in FIG. 1A.

This prior art SRAM has four thin film conductor layers and one Al (aluminum) interconnect wiring layer stacked on a semiconductor substrate. Specifically, these layers are, from the lowest layer, a gate electrode of a driver MOS transistor; a grounding (GND) wiring connected with the source of the driver MOS transistor; a bottom gate electrode of the p-TFT; a source, drain, channel of the p-TFT and a power supply line; and a bit line.

Hereunder, the structure of the above prior art SRAM device will be explained more specifically.

The driver MOS transistors of a flip-flop circuit are composed of an $n^+$-impurity-doped region (hereinafter referred to an impurity region) $1f$ serving as a common source, $n^+$-impurity regions $1e$, $1d$ constituting drains, and gate electrodes $3b$, $3c$. The gate electrodes $3b$ and $3c$ are cross-connected, through contact holes $2b$ and $2c$, with the impurity regions $1e$ and $1d$, respectively, which serve as the drains of paired transistors for each other.

The n-channel transfer MOS transistors connected with the flip-flop are composed of $n^+$-impurity regions $1c$, $1e$ serving as sources, $n^+$-impurity regions $1a$, $1b$ serving as drains, and a common gate electrode $3a$ serving as a word 6 line. The impurity region $1d$ also constitutes the drain of the driver MOS transistor. The impurity region $1c$ is connected with the $n^+$-impurity region $1e$ constituting the drain of the driver transistor through the contact holes $2a$, $2c$ and the gate electrode $3b$. These impurity regions $1e$, $1d$ and the gate electrodes and impurity regions connected with them constitute storage nodes.

The above $n^+$-impurity regions $1a$ and $1b$ are connected with bit lines $17a$ and $17b$ which are Al interconnect wirings through contact holes $16a$ and $16b$, respectively. The $n^+$-impurity region $1f$ constituting the common source of the driver MOS transistors is connected, through a contact hole 4, with a grounding (GND) wiring layer which is formed by the second layer wiring.

The load elements which are bottom gate type TFTs are composed of gate electrodes $7a$ and $7b$ which are connected with the gate electrodes $3b$ and $3c$ of the driver MOS transistors through the contact holes $6a'$ and $6b'$, respectively, and semiconductor thin films $9a$ and $9b$ which are formed on them through a gate insulating film 8.

The semiconductor thin films $9a$ and $9b$ form drain regions $10a$, $10b$, source regions $12a$, $12b$, channel regions $14a$, $14b$ and offset regions $15a$, $15b$ of the TFTs, and also form power supply wiring layers $13a$, $13b$ for supplying power to the memory cell.

The drain regions $10a$ and $10b$ of the TFTs are connected with the gate electrodes $7a$ and $7b$ through contact holes $11a$ and $11b$, respectively, and constitute storage nodes together with the gate electrodes $7a$ and $7b$, the gate electrodes $3b$ and $3c$ of the driver MOS transistors and the impurity regions $1c$ through $1d$. The source regions $12a$ and $2b$ of the TFTs are connected with the power supply wiring layers $13a$ and $13b$, respectively. Further, in order to improve the cut-off characteristics of the TFT, i.e., to reduce the off currents, the offset regions $15a$ and $15b$ doped with no impurity are provided between the channel regions $14a$, $14b$ and the drain regions $10a$, $10b$, respectively.

The prior art described above has the following problem to be solved. In order to ensure or enhance the stability of the CMOS-type SRAM cell, it is important to supply the grounding potential to a flip-flop with a low impedance. Where it is attempted to realize a minute cell size, the conventional cell structure cannot permit a large width of the grounding wiring layer 5 because of the limitation of layout, which makes it difficult to provide the grounding line with a low impedance. Namely, in the conventional cell structure, the width of the grounding wiring layer is determined by the positions of the contact holes $6a'$ and $6b'$ between which a margin should be left. Therefore, the width of the grounding wiring layer cannot be enlarged.

It is known that the off current of the load TFT is greatly affected by the electric field strength at the drain edge of the TFT. However, the conventional cell structure has the following structural problems. Namely, in the conventional cell structure, the gate electrodes $3b$ and $3c$ of the driver MOS transistors are located below the offset regions $15a$ and $15b$ of the TFTs. For this reason, the potential of the underlying gate electrode generates a change in the electric strength field for the drain of the TFT, which makes the off current characteristic unstable.

Further, in order to enhance the $\alpha$-ray resistance characteristic of a memory cell, it is necessary to provide a storage node with sufficient capacitance. In the conventional cell structure, however, the capacitance of the storage node with resect to the grounding wiring layer cannot be made large because of the above limitation in the layout of the grounding wiring layer. These are problems to be solved by the invention, in the conventional cell structure.

SUMMARY OF THE INVENTION

It is, therefore, an object of the invention to provide a CMOS-type SRAM cell with a stable operation.

It is another object of the invention to provide a CMOS-type SRAM cell with an improved $\alpha$-ray resistance strength.

According to one aspect of the invention, there is provided a fully CMOS-type static random access memory device comprising:

MOS transistors of a first conductivity type constituting driver transistors of a flip-flop type memory cell, formed on a main surface of a semiconductor substrate;

MOS thin film transistors of a second conductivity type constituting load transistors of the flip-flop memory cell, formed on the main surface of the semiconductor substrate; and a conductive thin film extending between the MOS transistors and the MOS thin film transistors, the conductive film being connected with a fixed potential power source and having holes opened in its contact hole portions for connecting the MOS transistors with the MOS thin film transistors.

According to another aspect of the invention, there is also provided a method for fabricating a fully CMOS-type static random access memory, comprising the steps of:

forming MOS transistors of a first conductivity type on a main surface of a semiconductor substrate, the MOS transistors constituting driver transistors of a flip-flop type memory cell;

forming, on the MOS transistors, a first insulating film, a conductive thin film, and a second insulating film;

selectively etching the first insulating film, the conductive thin film and the second insulating film to form contact hole portions for exposing surfaces of storage nodes of the flip-flop type memory cell;

forming a side wall made of insulator on an inner wall of each of the contact hole portions to form contact holes on the storage nodes; and forming MOS thin film transistors of a second conductivity type constituting load transistors of the flip-flop type memory cell, connected with the storage nodes through the contact holes, respectively.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Figure 1A:
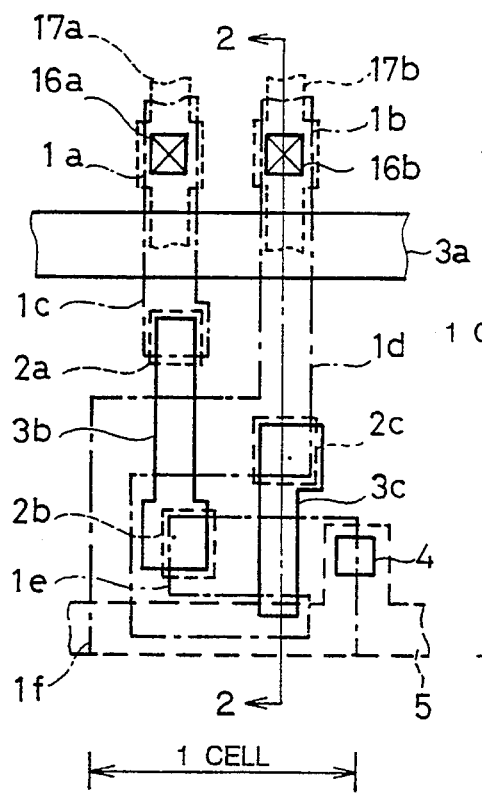
FIGS. 1A and 1B are plan views of a typical example of the prior art fully CMOS-type SRAM cell structure.
Figure 1B:
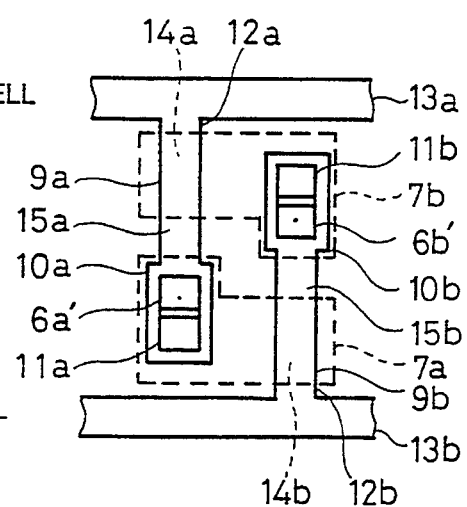
Figure 2:
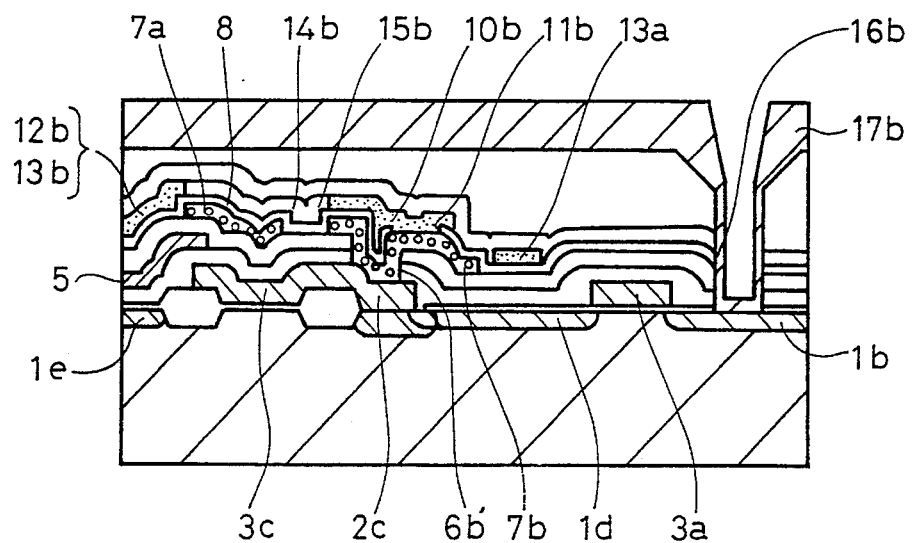
FIG. 2 is a sectional view taken along an A—A line in FIG. 1A.

Now, preferred embodiments of the present invention will be explained with reference to the accompanying drawings. Throughout the following explanation, the same or like reference numerals refer to the same or like elements in all the figures of the drawings.

First Embodiment

Figure 3A:
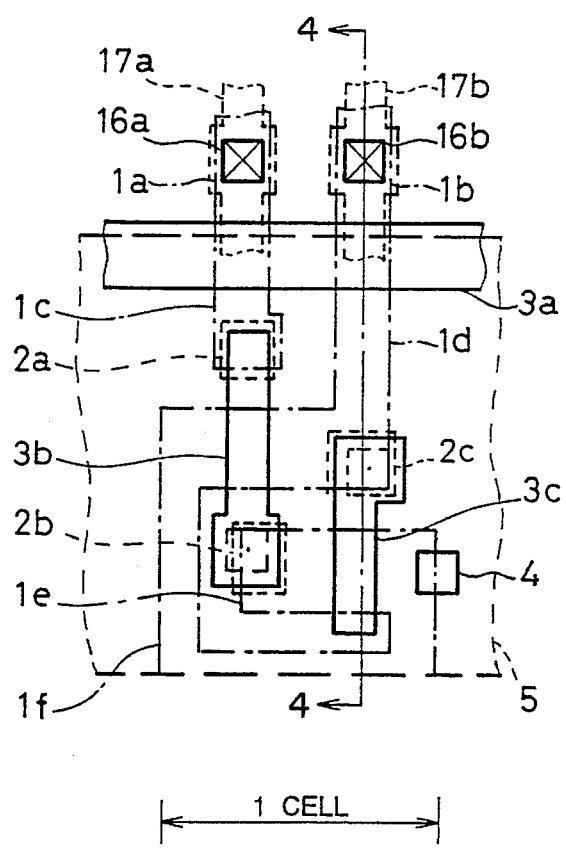
FIGS. 3A and 3B are plan views of a memory cell structure of a fully CMOS-type SRAM of a first embodiment according to the present invention.
Figure 3B:
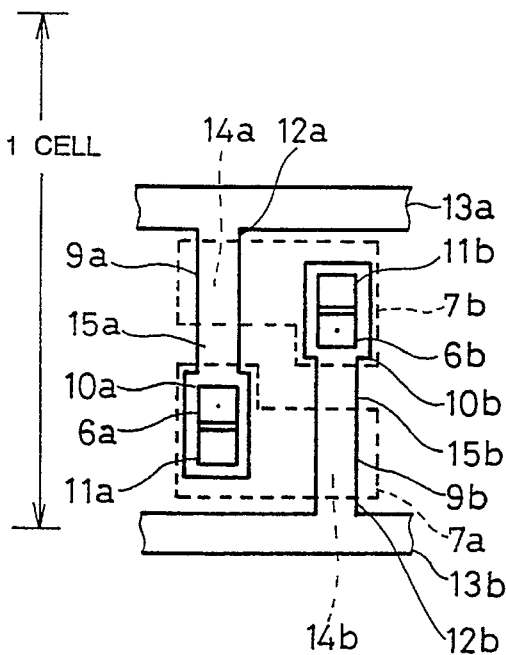
Figure 4:
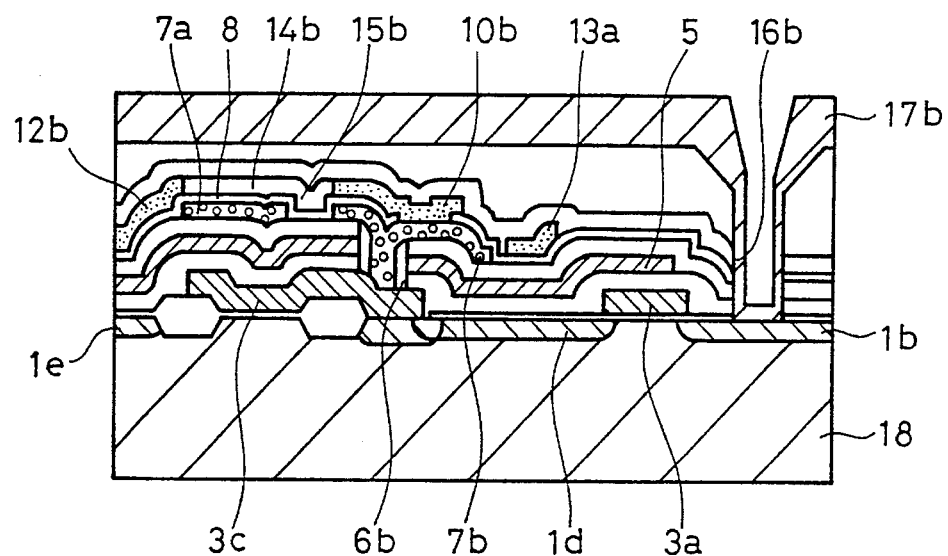
FIG. 4 is a sectional view taken along an A—A line in FIG. 3A.

FIGS. 3A and 3B are plan views of a CMOS-type SRAM of a first embodiment according to the invention. FIG. 3A shows impurity-diffused layer regions, MOS transistors, a grounding wiring layer, bit lines and contact holes for the bit lines, and FIG. 3B shows p-TFTs and power supply wiring layers. FIG. 4 is a sectional view taken along the line A—A in FIG. 3A.

As shown in FIG. 4, n-channel driver MOS transistors and n-channel transfer MOS transistors are formed on a p-well 18 in an n-type silicon substrate. Specifically, the transfer MOS transistors are composed of $n^+$-impurity regions $1a$, $1b$ servings as drains, $n^+$-impurity regions $1c$, $1d$ serving as sources, and a common gate electrode $3a$, respectively. The driver MOS transistors are composed of $n^+$-impurity regions $1e$, $1d$ serving as drains ($1d$ also serving as the source of the transfer MOS transistor), an $n^+$-impurity region $1f$ serving as a common source, and gate electrodes $3b$, $3c$, respectively.

The gate electrodes $3b$ and $3c$ of the driver MOS transistors are cross-connected, through contact holes $2b$ and $2c$, with the $n^+$-impurity regions $1e$ and $1d$ which are the drains of the paired transistors, respectively. The $n^+$-impurity region $1c$ is connected with the $n^+$-impurity region $1e$ through the contact hole $2a$, the gate electrode $3b$ and also the contact hole $2b$.

The drains $1a$ and $1b$ of the transfer MOS transistors are connected, through the contact holes $16a$ and $16b$, with bit lines $17a$ and $17b$ which are aluminum (Al) interconnect wiring layers, respectively.

The common source $1f$ of the driver MOS transistors is connected, through a contact hole $4$, with a grounding wiring layer $5$ which is a second layer conductive film. This grounding layer is structured so as to cover the entire memory cell except the contact hole portions $16a$, $16b$, and the contact hole portions $6a$, $6b$ for connecting the storage nodes $1e$, $1d$ with the gate electrodes of p-TFTs.

The p-TFTs have a bottom gate structure. Specifically, their gate electrodes $7a$ and $7b$ are connected with the gate electrodes $3b$ and $3c$ of the driver MOS transistors through contact holes self-aligned for the contact hole portions $6a$ and $6b$ opened in the grounding wiring layer $5$.

Formed on the gate electrodes $7a$ and $7b$ of the p-TFTs are semiconductor thin films $9a$ and $9b$ of amorphous silicon which constitute drain regions $10a$, $10b$, source regions $12a$, $12b$ and channel regions $14a$, $14b$ of the TFTs.

The semiconductor thin films $9a$ and $9b$ also constitute the grounding wiring layers $13a$, $13b$ connected with the source regions $12a$, $12b$, and offset regions $15a$, $15b$ formed between the drain regions $10a$, $10b$ and the channel regions $14a$, $14b$ to improve the cut-off characteristics of the TFTs.

The drain regions $10a$, $10b$ of the TFTs are cross-connected, through the contact holes $11a$ and $11b$, with the gate electrodes $7a$ and $7b$ of the paired transistors, respectively.

As described above, the grounding wiring layer $5$ is so structured that it covers the entire memory cell except the predetermined portions as mentioned above, so that it provides low grounding impedance and also large electrostatic capacitances at the gate electrode $3a$ of the driver MOS transistors with respect to the grounding wiring layer $5$ and the gate electrodes $7a$, $7b$ of the TFTs with respect to the grounding wiring layer $5$, hence, at the storage nodes $1e$, $1d$ of the memory cell with respect to the grounding wiring layer $5$. Further, the grounding wiring layer $5$ is extended immediately below the offset regions $15a$, $15b$ of the TFTs so as to electrically shield them. For this reason, a change in The potentials at the gate electrodes of the underlying driver MOS transistors will not influence on the off-currents of the TFTs.

Referring next to FIGS. 5A through 5D, an explanation will be given of the process for fabricating the CMOS-type SRAM cell according To the above described first embodiment of the invention.

First, a p-well is formed on the main surface of an n-type silicon substrate. A device-isolation region is formed on the p-well surface by the Local Oxidation of Silicon (LOCOS) method., The gate electrodes 3a and 3c of the transfer MOS transistor and the driver MOS transistor each having a polycide structure are formed on a gate insulating film 20.

Then, in order To cross-connect the gate electrodes and drain regions of the two driver MOS transistors, contact holes 2c are formed in advance at a predetermined area in the gate insulating film 20 prior to depositing polycide electrode material. In forming the gate electrode, phosphorus (P) is diffused through the contact hole 2c from the polycide to form an n-impurity diffused region 21.

The known steps of ion-injection and forming a side-wall 22 are executed to form $n^+$-impurity regions 1b, 1d and 1f of a Lightly Doped Drain (LDD) structure. Subsequently, an interlayer insulating film 23 of an silicon dioxide film is deposited on the entire surface by the Low-Pressure Chemical Vapor Deposition (LPCVD) method and, then, a contact hole (not shown) exposing the surface of the source of the driver MOS transistors is formed by the photolithography method.

Figure 5A:
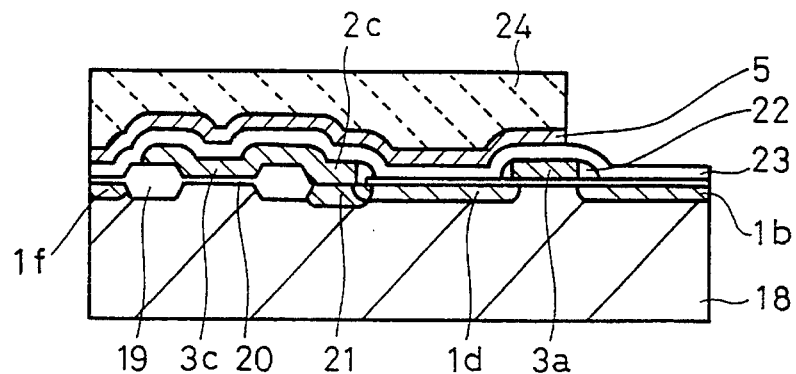
FIGS. 5A through 5D are sectional views showing the steps of the process for fabricating the CMOS-type SRAM cell of the first embodiment according to the present invention.

The second layer conductive film of WSix is deposited on the resultant surface. The bit line contact area of the memory cell portion is removed by etching using photoresist 24 as a mask to form a grounding wiring layer 5 (FIG. 5A). Then, the wiring layer of the peripheral circuits for the memory device is also formed.

Figure 5B:
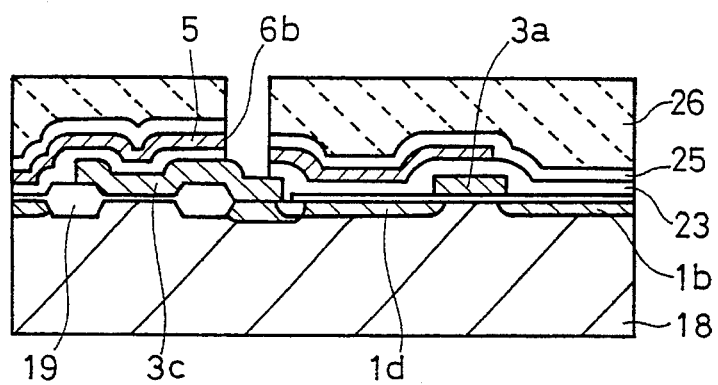

A silicon oxide film is deposited on the entire surface by the LPCVD method to form an interlayer insulating film 25. Photoresist 26 is applied to the insulating film 25 to define the area where a contact hole for connecting the bottom gate of the TFT with a memory cell storage node is to be formed. Three layers of the interlayer insulating film 25, the grounding wiring layer 5 and the interlayer insulating film 23 are removed by anisotropic etching using the photoresist 26 as a mask to form a contact hole portion 6b (FIG. 5B).

Figure 5C:
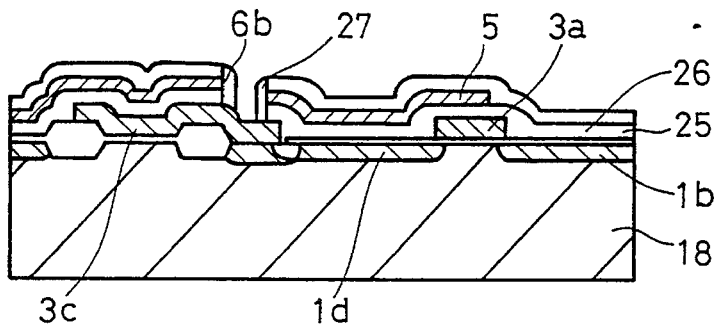

Subsequently, a silicon oxide film is deposited on the entire surface by the LPCVD method. It is etched back by the anisotropic etching to form a contact hole self-aligned for the pattern of the grounding wiring layer 5 with a side wall 27 of a silicon oxide film being left on the side wall portion of the contact hole portion 6b (FIG. 5C).

Then, a polycrystalline silicon layer is deposited on the surface and doped with n-type impurities. It is etched in a predetermined pattern to form the gate electrodes 7a and 7b of the load TFTs. The gate insulating film 8 of an silicon oxide film for the TFTs is deposited on the surface by the LPCVD method, and a contact hole for cross-connecting the gate electrode and the drain region of the p-TFTs is formed in it. Thereafter, an amorphous silicon layer having a thickness of 800 Å is deposited on the surface by the LPCVD method using monosilane at 520° C.

Thereafter, the substrate is annealed at the low temperature (about 600° C.) for a long time (8–96 hours) to further crystallize the amorphous silicon layer. In order to control the threshold voltage (VT) of the p-TFT, the amorphous silicon layer is ion-implanted with phosphorus (P) at the dosage of $1 \times 10^{12} \sim 2 \times 10^{13}$ cm$^{-2}$. This semiconductor thin film is shaped into a pattern of the necessary source, channel and drain regions of the TFTs and the power source wiring layers by the known photo-etching technique.

Figure 5D:
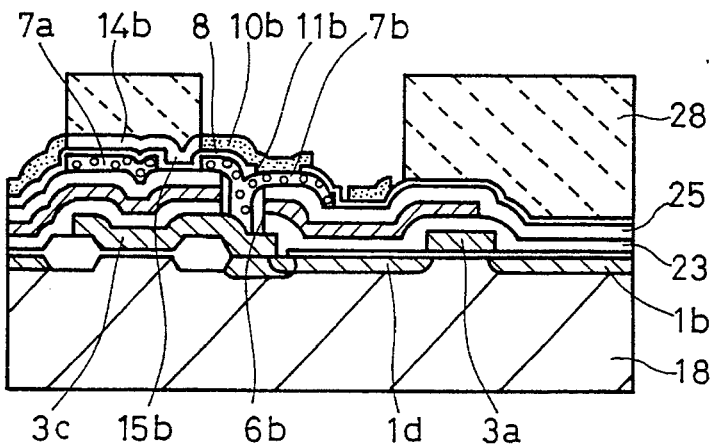

A photoresist film 28 is formed to dope selectively the source/drain regions of the p-TFTs and also the power source wiring layers with p-type impurities and, then, $BF_2^+$ is ion-implanted through the photoresist film 28 at the acceleration energy of 30 keV and the dosage of $1 \times 10^{14} \sim 5 \times 10^{15}$ cm$^{-2}$. Then, an offset region 15b ranging from 0.3–0.6 μm in length which is not doped with p-type impurity is provided between the channel region 14b and the drain region 10b of the TFT, thereby improving the cut-off characteristics of the TFT (FIG. 5D).

Finally, a silicon oxide film and a BPSG film are deposited on the entire surface by the LPCVD method, and these films are subjected to fellow by the heat-treatment, thereby flattening the surface. A bit-line contact hole 16b for drawing a bit line is formed, and a bit line 17b made of Al is also formed. Thus, the device shown in FIG. 4 is completed.

Second Embodiment

Figure 6A:
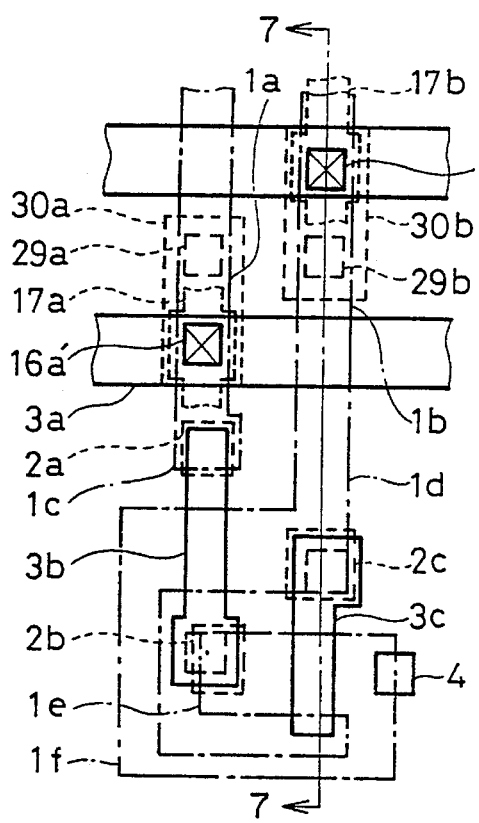
FIGS. 6A and 6B are plan views of a memory cell structure of a fully CMOS-type SRAM cell of a second embodiment according to the present invention.
Figure 6B:
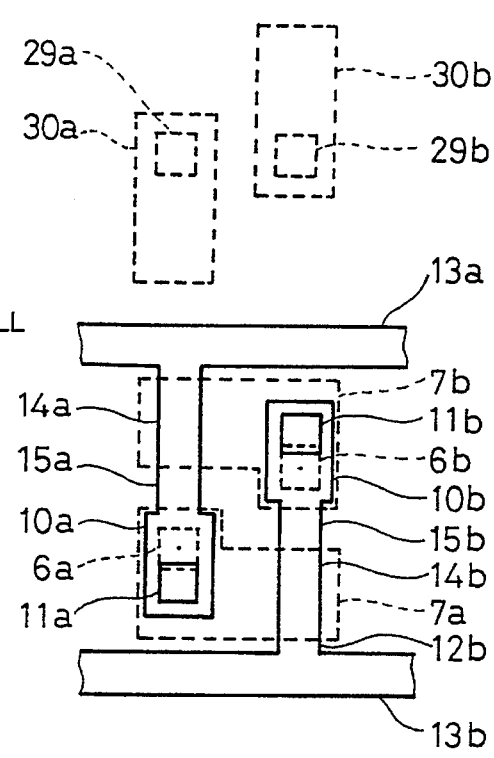
Figure 7:
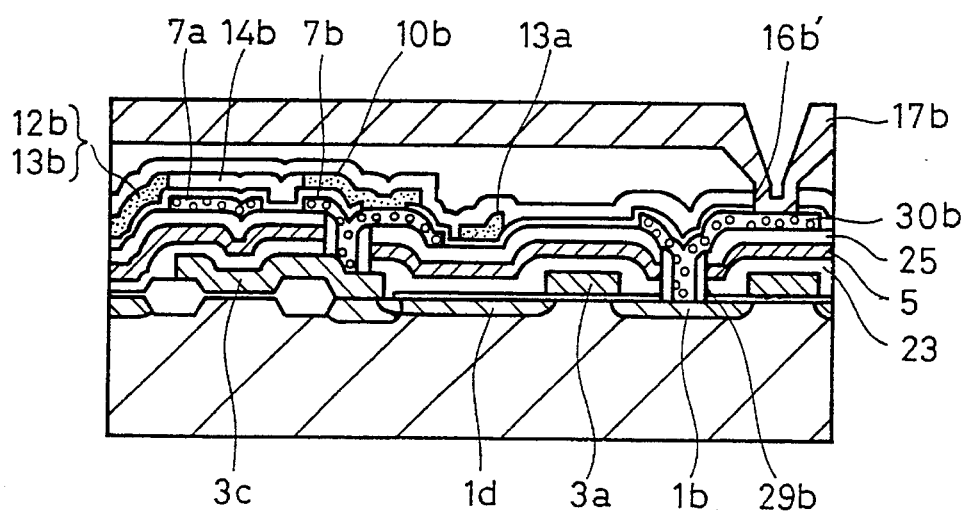
FIG. 7 is a sectional view taken along an A—A line in FIG. 6A.

FIGS. 6A and 6B are plan views of a CMOS-type SRAM of a second embodiment according to the invention. FIG. 7 is a sectional view taken along the line A—A in FIG. 6A.

The SRAM cell structure according to this second embodiment is different from that according to the first embodiment in that the grounding wiring layer 5 is extended onto the transfer MOS transistors and their drains are connected with the bit lines 17a, 17b through drawing electrodes 30a, 30b.

The drawing electrodes 30a and 30b are connected with the $n^+$-impurity regions 1a and 1b, respectively, through the contact holes formed by providing side walls in contact hole portions 29a and 29b opened in the interlayer insulating films 28 and 25 and the grounding wiring layer 5 intervening between them, i.e., through the contact holes self-aligned for the holes in the grounding wiring layer 5. These contact hole portions 29a, 29b and the contact holes made thereat are formed simultaneously with the formation of the contact hole portions 6a, 6b for connecting the gate electrodes 7a, 7b of the p-TFTs with the underlying storage nodes and the contact holes made thereat. Thus, the drawing electrodes 30a and 30b are formed simultaneously with the formation of the gate electrodes 7a and 7b using the same semiconductor thin film.

The drawing electrodes 30a and 30b are connected with the bit lines 17a and 17b made of aluminum (Al) through the contact holes 16a' and 16b', respectively.

The structure described above is without a break or gap in the grounding wiring layer in the memory cell area, so that it can provide the grounding wiring with still lower impedance. This permits a more stabilized memory operation to be performed. Further, the adoption of the drawing electrodes contributes to the reduction in the steps at the bit line contact portions, thereby improving greatly the coverage of the Al interconnect wirings at the contact portions.

Although, in the two embodiments described above, the p-channel bottom gate type TFTs were used as load elements, the present invention should not be limited to it. The load may be a top gate type TFT or a dual gate type TFT in which the gate electrodes are provided above and below its channel region.

Further, a TFT with no offset region may be used in place of the TFT with an offset region as explained in connection with the above embodiments. The TFT in an LDD structure may be used in which the offset region is lightly doped with p-type impurities.

As described above, in accordance with the present invention, the contact holes for connecting the gate electrodes of load TFTs with storage nodes are formed in self-alignment for the holes opened in the grounding wiring layer, so that there is no break or gap of the grounding wiring layer over the substantially entire area of the memory cell area. Therefore, in accordance with the present invention, the memory cell can be supplied with the grounding potential with substantially low impedance, thus stabilizing the operation of the memory. This effect is particularly remarkable in advanced reduction in the size of the memory cell and in the operation of the memory cell at a low voltage.

The provision of the grounding wiring layer between the gate electrodes of the MOS transistors formed on a substrate and the gate electrodes of the load TFTs can increase the capacitance of each of these gates with respect to the grounding (GND) layer and hence the capacitance of the storage nodes of the memory cell, thus improving or enhancing the resistance to software error caused by α-ray.

Further, the provision of the grounding wiring layer between the load TFTs and the driver MOS transistors restricts the influence of a change in the potentials at the gate electrodes of the underlying MOS transistors upon the off currents of the TFTs, thus stabilizing the operation of the TFT load type SRAM device.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a static random access memory device, comprising the steps of:

forming, on a main surface of a semiconductor substrate, driver MOS transistors of a first conductivity constituting driver transistors of a flip-flop memory cell, and transfer MOS transistors of said first conductivity having sources connected with drains of said driver MOS transistors;

forming, on said driver and transfer MOS transistors, a first insulating film, a conductive thin film, and a second insulating film;

selectively etching said second insulating film, said conductive thin film and said first insulating film to form first and second contact hole portions exposing surfaces of storage nodes of said flip-flop memory cell and surfaces of the drains of said transfer MOS transistors respectively;

forming side walls made of an insulating material on inner walls of said first and second contact hole portions to form first and second contact holes on said storage nodes and the drains of said transfer MOS transistors, respectively;

forming MOS thin film transistors of a second conductivity constituting load transistors of said flip-flop memory cell, connected with the said storage nodes through said first contact holes;

forming drawing electrodes connected with the drains of said transfer MOS transistors through said second contact holes; and forming bit lines connected with said drawings electrode, respectively.

* * * * *